(12) United States Patent  
Kim et al.

(10) Patent No.: US 12,147,638 B2  
(45) Date of Patent: *Nov. 19, 2024

(54) DISPLAY DEVICE

(71) Applicant: Samsung Display Co., Ltd., Yongin-Si (KR)

(72) Inventors: Kwanghyeok Kim, Yongin-si (KR); Yonghwan Park, Yongin-si (KR); Miyoung Kim, Yongin-si (KR); Soyeon Park, Yongin-si (KR); Sanghyun Jun, Yongin-si (KR); Sugwoo Jung, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/144,880

(22) Filed: May 9, 2023

(65) Prior Publication Data

US 2023/0273702 A1 Aug. 31, 2023

Related U.S. Application Data

(63) Continuation of application No. 17/403,937, filed on Aug. 17, 2021, now Pat. No. 11,675,465.

(30) Foreign Application Priority Data

Dec. 16, 2020 (KR) .................. 10-2020-0176601

(51) Int. Cl.
*G06F 3/044* (2006.01)
*H10K 59/12* (2023.01)
*H10K 59/40* (2023.01)

(52) U.S. Cl.
CPC .......... *G06F 3/0446* (2019.05); *G06F 3/0448* (2019.05); *H10K 59/12* (2023.02); *H10K 59/40* (2023.02); *G06F 2203/04111* (2013.01)

(58) Field of Classification Search
None
See application file for complete search history.

(56) References Cited

U.S. PATENT DOCUMENTS 9,377,906 B2 * 6/2016 Lee ..................... G06F 3/04184
9,508,778 B2 * 11/2016 Kim ..................... H10K 59/122
(Continued)

FOREIGN PATENT DOCUMENTS

CN 102033672 A * 4/2011
KR 10-1330320 B1 11/2013
(Continued)

*Primary Examiner* — Amy Onyekaba  
(74) *Attorney, Agent, or Firm* — Innovation Counsel LLP

(57) ABSTRACT

A display device includes a display area in which red, green, and blue sub-pixels are arranged, and a touch sensing layer including a conductive pattern, the conductive pattern including touch electrodes arranged in a row direction and a column direction in the display area, and trace lines electrically connected to the touch electrodes, respectively, and extending in the column direction in the display area. Here, the conductive pattern includes touch pattern unit blocks arranged along the row direction, each of the touch pattern unit blocks including some parts of the plurality of trace lines and at least one touch electrode among the plurality of touch electrodes, and the touch pattern unit block has a size corresponding to an integer multiple of a size of a pixel unit block, wherein the pixel unit block is a minimum repetition unit of the red, green, and blue sub-pixels.

23 Claims, 15 Drawing Sheets

(56) References Cited

U.S. PATENT DOCUMENTS

| | | | |
|---|---|---|---|
| 9,671,886 B2* | 6/2017 | Yoo | G06F 3/0412 |
| 10,133,431 B2 | 11/2018 | Lee | |
| 10,620,732 B2* | 4/2020 | Oh | G06F 3/0412 |
| 10,692,942 B2* | 6/2020 | Kim | H10K 59/122 |
| 11,183,555 B2* | 11/2021 | Yi | G06F 3/0412 |
| 2016/0239120 A1* | 8/2016 | Jeong | G06F 3/0446 |
| 2016/0283005 A1* | 9/2016 | Lee | G06F 3/0445 |
| 2017/0301280 A1* | 10/2017 | Ka | G09G 3/3406 |
| 2018/0059837 A1* | 3/2018 | Kim | G06F 3/0446 |
| 2018/0150162 A1* | 5/2018 | Kim | G06F 11/2221 |
| 2018/0151637 A1* | 5/2018 | Kajiyama | H10K 59/353 |
| 2018/0157354 A1* | 6/2018 | Blondin | G06F 3/04164 |
| 2018/0286925 A1* | 10/2018 | Kim | H10K 50/8428 |
| 2018/0292934 A1* | 10/2018 | Xu | G06F 3/0443 |
| 2018/0373104 A1* | 12/2018 | Qin | G02F 1/136227 |
| 2019/0302936 A1* | 10/2019 | Clark | G06F 3/0412 |
| 2019/0348476 A1* | 11/2019 | Kato | H10K 50/844 |
| 2019/0391431 A1* | 12/2019 | Morinaga | G06F 3/044 |
| 2020/0020263 A1* | 1/2020 | Shin | G02F 1/13458 |
| 2020/0081308 A1* | 3/2020 | Yoshida | G02F 1/13306 |
| 2020/0286963 A1 | 9/2020 | Lee et al. | |
| 2020/0293150 A1* | 9/2020 | Jeong | G06F 3/0443 |
| 2020/0321404 A1* | 10/2020 | Kim | H10K 50/805 |
| 2021/0096667 A1* | 4/2021 | Chen | G06F 3/046 |
| 2021/0175295 A1 | 6/2021 | Lee et al. | |
| 2021/0175299 A1 | 6/2021 | Lee et al. | |
| 2021/0191208 A1* | 6/2021 | Lee | G06F 3/04166 |
| 2022/0102449 A1* | 3/2022 | Kim | H10K 50/82 |
| 2022/0146874 A1* | 5/2022 | Yoshida | G06F 3/04164 |
| 2022/0187937 A1* | 6/2022 | Jang | G06F 3/04164 |
| 2022/0199605 A1* | 6/2022 | Chaji | G09G 3/32 |

FOREIGN PATENT DOCUMENTS

| | | |
|---|---|---|
| KR | 10-2016-0001482 A | 1/2016 |
| KR | 10-2018-0112165 A | 10/2018 |

* cited by examiner

DISPLAY DEVICE

CROSS-REFERENCE TO RELATED APPLICATION

This application is a continuation application of U.S. patent application Ser. No. 17/403,937 filed on Aug. 17, 2021, which claims priority under 35 U.S.C. § 119 to Korean Patent Application No. 10-2020-0176601, filed on Dec. 16, 2020, in the Korean Intellectual Property Office, the disclosure of which is incorporated by reference herein in its entirety.

BACKGROUND

1. Field

One or more embodiments relate to a display device.

2. Description of the Related Art

As a display device becomes portable, the display device has been designed to have various functions. One of the various functions may include a touch input function. A display device may recognize a location of a finger of a user or an input device such as a stylus pen in contact with a surface of the display device.

SUMMARY

A display device may include electrodes for implementing a touch function as described above, and after forming touch electrodes, an inspection for checking defects may be performed. A defect inspection may be performed by capturing an image having a certain size by using a camera and comparing captured images, and when the image is captured, elements under the touch electrodes may cause light interference, and thus, it may not be easy to detect defects by using captured images. One or more embodiments include a display device in which a defect inspection may be easily performed and which has improved display quality. However, the above technical features are examples, and the scope of the disclosure is not limited thereto.

Additional aspects will be set forth in part in the description which follows and, in part, will be apparent from the description, or may be learned by practice of the presented embodiments of the disclosure.

According to an embodiment, a display device includes a display area in which red, green, and blue sub-pixels are arranged, and a touch sensing layer including a conductive pattern, the conductive pattern including a plurality of touch electrodes arranged in a row direction and a column direction in the display area, and a plurality of trace lines electrically connected to the plurality of touch electrodes, respectively, and extending in the column direction in the display area, wherein the conductive pattern of the touch sensing layer includes a plurality of touch pattern unit blocks arranged along the row direction, each of the touch pattern unit block including some parts of the plurality of trace lines and at least one touch electrode among the plurality of touch electrodes, and the touch pattern unit block has a size corresponding to an integer multiple of a size of a pixel unit block, wherein the pixel unit block is a minimum repetition unit of the red, green, and blue sub-pixels.

The display device may further include a plurality of spacers spaced apart from one another in the display area.

At least one of the plurality of spacers may overlap at least one of the plurality of trace lines.

Each of the plurality of touch electrodes may have a polygonal shape.

Each of the plurality of touch electrodes may have zigzag edges and the touch pattern unit block may include some parts of two adjacent touch electrodes.

One of the plurality of trace lines may be electrically connected to one of the plurality of touch electrodes via a bridge line and at least one trace line of the plurality of trace lines may include disconnected parts in a region corresponding to the bridge line.

The display device may further include dummy touch electrodes disposed adjacent to the plurality of touch electrodes, respectively.

A width of each of the dummy touch electrodes may be less than a width of the pixel unit block.

The touch pattern unit block may overlap pixel unit blocks in K rows and L columns (here, K and L are natural numbers) and some of the plurality of trace lines may correspond to one of the L columns of the pixel unit blocks.

Some of the plurality of trace lines may include a plurality of first metal lines spaced apart from one another and each of the plurality of first metal lines may be disposed between adjacent sub-pixels in the pixel unit blocks corresponding to the one of the L columns.

The at least a part of one touch electrode may include a plurality of second metal lines that are connected to one another and is disposed corresponding to the pixel unit block at an a-th row and a b-th column among the pixel unit blocks of the K rows and the L columns (here, a is a natural number less than K and b is a natural number less than L).

According to another embodiment, a display device includes a display area in which red, green, and blue sub-pixels are arranged, a plurality of spacers in the display area, a conductive pattern layer including a conductive pattern, the conductive pattern including a plurality of touch electrodes arranged in a row direction and a column direction in the display area, and a plurality of trace lines electrically connected to the plurality of touch electrodes and extending in the column direction in the display area, a first insulating layer under the conductive pattern layer, and a second insulating layer over the conductive pattern layer, wherein the conductive pattern of the conductive pattern layer includes each of the touch pattern unit block including some parts of the plurality of trace lines and at least one touch electrode among the plurality of touch electrodes, the plurality of touch electrodes arranged along the row direction among the plurality of touch electrodes are electrically connected to different trace lines, respectively, and the touch pattern unit block has a size corresponding to an integer multiple of a size of a pixel unit block that is a minimum repetition unit of the red, green, and blue sub-pixels.

At least one of the plurality of spacers may overlap at least one of the plurality of trace lines.

Each of the plurality of touch electrodes may have a polygonal shape.

Each of the plurality of touch electrodes may have zigzag edges and the touch pattern unit block may include some parts of two adjacent touch electrodes.

One of the plurality of trace lines may be electrically connected to one of the plurality of touch electrodes via a bridge line and at least one trace line of the plurality of trace lines may include disconnected parts in a region corresponding to the bridge line.

The display device may further include dummy touch electrodes disposed adjacent to the plurality of touch electrodes, respectively, wherein the touch pattern unit block may include at least a part of one of the dummy touch electrodes.

A width of the one of the dummy touch electrodes may be less than a width of the pixel unit block.

The touch pattern unit block may overlap pixel unit blocks in K rows and L columns (here, K and L are natural numbers) and some of the plurality of trace lines may include a plurality of first metal lines which correspond to one of the L columns of the pixel unit blocks and are spaced apart from one another.

Each of the plurality of first metal lines may be disposed between adjacent sub-pixels in the pixel unit blocks corresponding to the one of the L columns.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
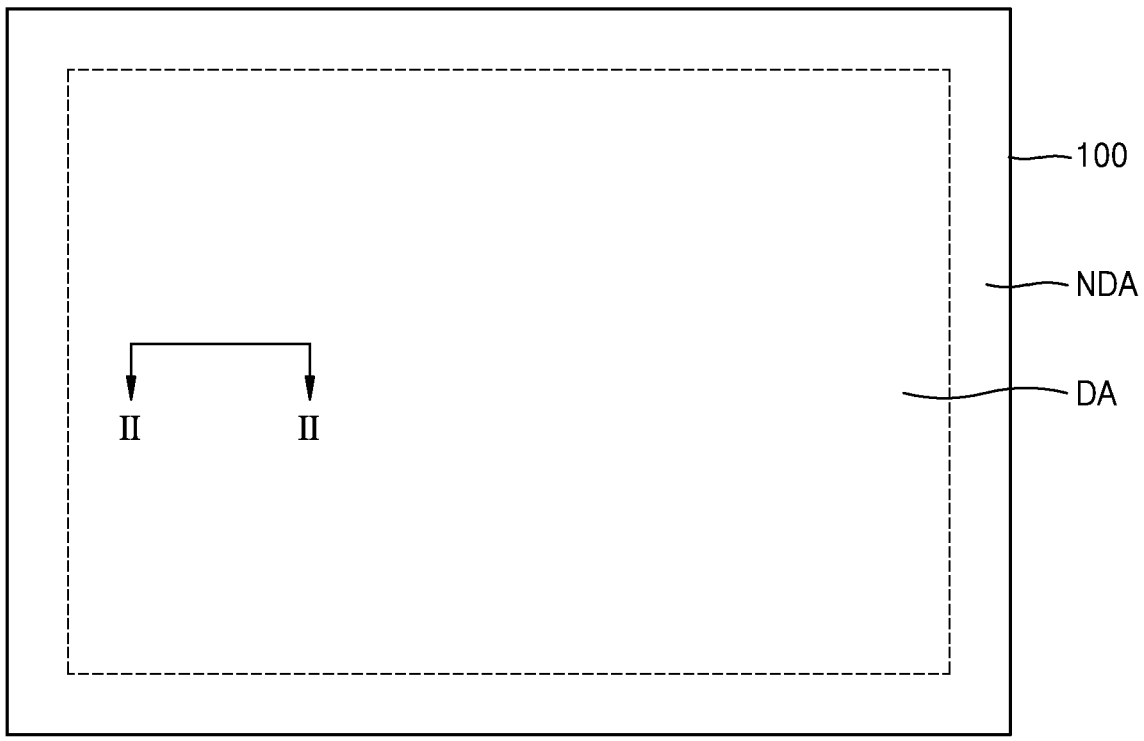
FIG. 1 is a plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. In this regard, the present embodiments may have different forms and should not be construed as being limited to the descriptions set forth herein. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Figure 2:
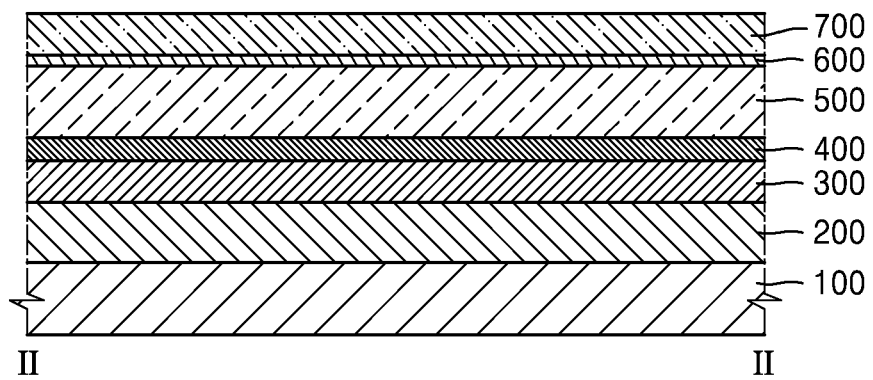
FIG. 2 is a cross-sectional view of the display device taken along line II-II of FIG. 1.

FIG. 1 is a cross-sectional view showing a display device according to an embodiment, and FIG. 2 is a cross-sectional view of the display device taken along a line II-II of FIG. 1.

Referring to FIG. 1, the display device includes a display area DA and a non-display area NDA. Sub-pixels including a display element such as a light-emitting diode are disposed in the display area DA to provide certain images. The non-display area NDA does not provide images, and may surround the display area DA. A scan driver and a data driver for providing electrical signals applied to the sub-pixels in the display area DA and power lines for providing electric power such as a driving voltage or a common voltage are disposed in the non-display area NDA.

As shown in FIG. 2, the display device includes a display layer 200 formed in the display area DA on the substrate 100. The substrate 100 may include various materials, for example, a glass material, a metal material, a plastic material such as polyethylene terephthalate (PET), polyethylene naphthalate (PEN), polyimide, etc. The display layer 200 includes the sub-pixels each including a light-emitting diode and may provide a certain image.

An encapsulation layer 300 may cover the display layer 200. The encapsulation layer 300 may protect the display layer 200 against external moisture, oxygen, etc. A touch sensing layer 400 may be disposed on the encapsulation layer 300.

The touch sensing layer 400 may include a plurality of touch electrodes having conductivity. For example, the touch sensing layer 400 may be a capacitive type touch sensor. The touch sensing layer 400 may sense a coordinate of a position where an object approaches or contacts by using a variation in a capacitance which is generated when an object such as a finger of a user approaches or contacts a surface of the touch sensing layer 400.

An optical functional layer 500 may be disposed on the touch sensing layer 400. The optical functional layer 500 may include an anti-reflection layer. The anti-reflection layer may include a retarder and a polarizer or may include a black matrix and a color filter.

A cover window 700 may be disposed on the optical functional layer 500 with an adhesive layer 600 disposed between the optical functional layer 500 and the cover window 700. The adhesive layer 600 may include an optical clear adhesive (OCA).

The cover window 700 may include a flexible window. For example, the cover window 700 may include a plastic window such as polyimide, or an ultra-thin glass window.

Figure 3:
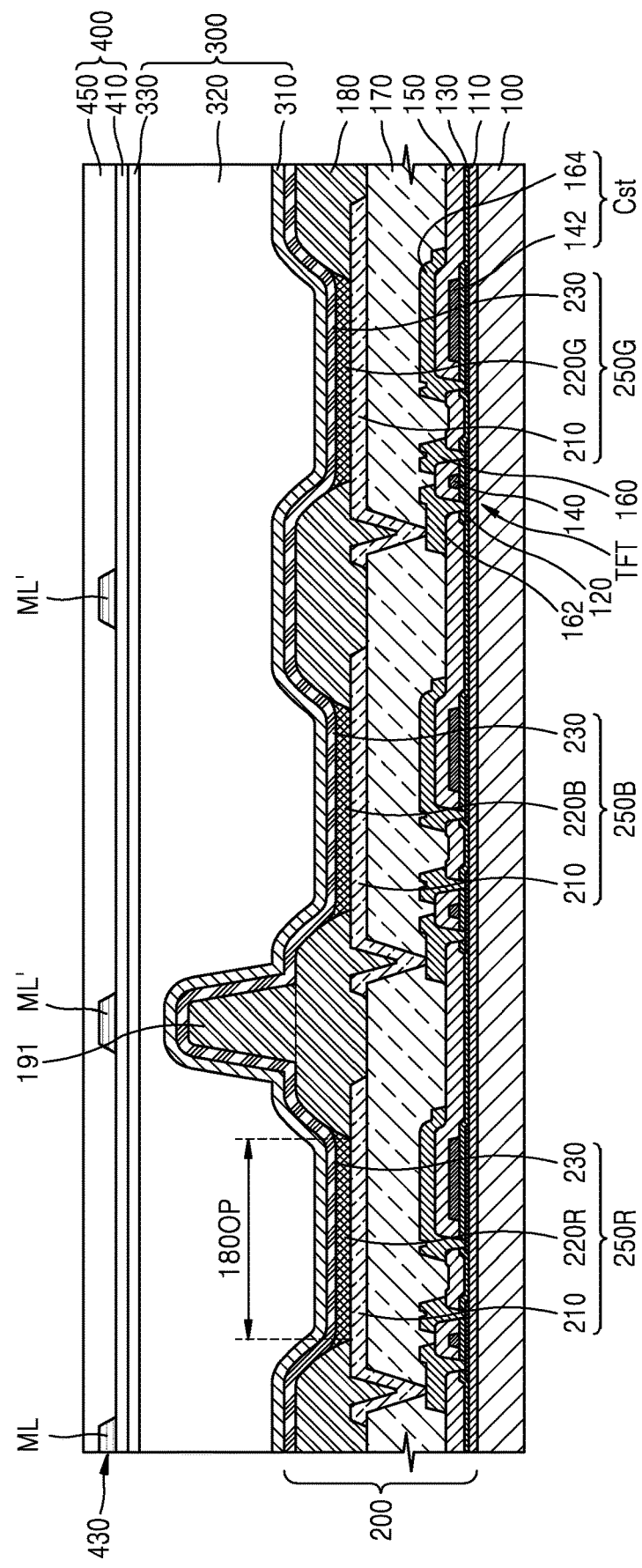
FIG. 3 is a cross-sectional view showing a substrate, a display layer, an encapsulation layer, and a touch sensing layer of FIG. 2.

FIG. 3 is a cross-sectional view showing the substrate 100, the display layer 200, the encapsulation layer 300, and the touch sensing layer 400 of FIG. 2.

Referring to FIG. 3, the display layer 200 is disposed on the substrate 100, and the display layer 200 may include light-emitting diodes 250R, 250B, and 250G each of which is disposed in each sub-pixel. Each of the light-emitting diodes 250R, 250B, and 250G is electrically connected to a thin film transistor TFT and a storage capacitor Cst.

The thin film transistor TFT may include a semiconductor layer 120, a gate electrode 140 overlapping a partial region (channel region) of the semiconductor layer, and a source electrode 160 and a drain electrode 162 connected to the semiconductor layer 120. The semiconductor layer 120 may include an inorganic semiconductor such as silicon, an organic semiconductor, or an oxide semiconductor material. The semiconductor layer 120 may have a source region, a drain region, and a channel region disposed between the source and drain regions.

The gate electrode 140 may overlap the channel region of the semiconductor layer 120. The gate electrode 140 may have a single or multi-layered structure including one or more materials from aluminum (Al), platinum (Pt), palladium (Pd), argentum (Ag), magnesium (Mg), aurum (Au), nickel (Ni), neodymium (Nd), iridium (Jr), chromium (Cr), lithium (Li), calcium (Ca), molybdenum (Mo), titanium (Ti), tungsten (W), and copper (Cu).

A buffer layer 110 may be disposed between the semiconductor layer 120 and the substrate 100 in order to prevent infiltration of impurities into the display layer 200. A gate insulating layer 130 may be disposed between the semiconductor layer 120 and the gate electrode 140, and an interlayer insulating layer 150 is disposed on the gate electrode 140. The buffer layer 110, the gate insulating layer 130, and/or the interlayer insulating layer 150 may include an inorganic insulating material such as silicon oxide, silicon nitride, and silicon oxynitride in a single-layered or multi-layered structure including the above-stated materials.

The source electrode 160 and the drain electrode 162 may be disposed on the interlayer insulating layer 150 and may be respectively connected to the source region and the drain region of the semiconductor layer 120. The source electrode 160 and the drain electrode 162 may each have a single or multi-layered structure including one or more materials from aluminum (Al), platinum (Pt), palladium (Pd), argentum (Ag), magnesium (Mg), *aurum* (Au), nickel (Ni), neodymium (Nd), iridium (Jr), chromium (Cr), lithium (Li), calcium (Ca), molybdenum (Mo), titanium (Ti), tungsten (W), and copper (Cu).

The storage capacitor Cst may include a lower electrode 142 and an upper electrode 164. The lower electrode 142 includes the same material as that of the gate electrode 140 and the upper electrode 164 may include the same material as that of the source electrode 160 or the drain electrode 162, but one or more embodiments are not limited thereto.

The thin film transistor TFT and the storage capacitor Cst may be covered by a planarized insulating layer 170. The planarized insulating layer 170 may include an organic insulating material. The organic insulating material may include a material such as a general universal polymer (PMMA, PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In some embodiments, the planarized insulating layer 170 may include both an inorganic insulating material and an organic insulating material.

The light-emitting diodes 250R, 250B, and 250G may be disposed on the planarized insulating layer 170. Each of the light-emitting diodes 250R, 250B, and 250G may be electrically connected to the thin film transistor TFT via a contact hole defined in the planarized insulating layer 170. FIG. 3 shows an example in which the light-emitting diodes 250R, 250B, and 250G are organic light-emitting diodes.

The light-emitting diodes 250R, 250B, and 250G may emit light of different colors. The red light-emitting diode 250R may include a first electrode 210, an organic light-emitting layer 220R emitting red light, and a second electrode 230, and be disposed corresponds to a first sub-pixel (red sub-pixel) emitting red light. The blue light-emitting diode 250B may include the first electrode 210, an organic light-emitting layer 220B emitting blue light, and the second electrode 230, and be disposed corresponds to a second sub-pixel (blue sub-pixel) emitting blue light. The green light-emitting diode 250G may include the first electrode 210, an organic light-emitting layer 220G emitting green light, and the second electrode 230, and be disposed corresponds to a third sub-pixel (green sub-pixel) emitting green light.

The first electrode 210 may include a reflective electrode. The first electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. In another embodiment, the first electrode 210 may further include a film including indium tin oxide (ITO), indium zinc oxide (IZO), zinc oxide (ZnO), indium oxide ($In_2O_3$), etc. disposed on the above reflective layer. For example, the first electrode 210 may have a triple-layered structure including ITO/Ag/ITO.

An upper insulating layer 180 may be disposed on the first electrode 210. The upper insulating layer 180 may have openings 1800P exposing centers of the first electrode 210 to define emission areas of the light-emitting diodes 250R, 250B, and 250G and/or the sub-pixels. A width of the opening 1800P may correspond to a width of the emission area.

The upper insulating layer (or a bank layer) 180 increases a distance between an edge of the first electrode 210 and the second electrode 230, and thus, may prevent generation of arc at the edge of the first electrode 210. The upper insulating layer 180 may include a light-transmitting organic insulating material such as polyimide (PI) or hexamethyldisiloxane (HMDSO), etc. Alternatively, the upper insulating layer 180 may include a colored organic insulating material such as a black organic insulating material.

A spacer 191 may be disposed on the upper insulating layer 180. For example, the spacer 191 may be directly disposed on the upper insulating layer 180. The spacer 191 supports a mask that is used in a deposition process of organic light-emitting layers 220R, 220B, and 220G that will be described later, and may prevent or reduce defects in the organic light-emitting layers 220R, 220B, and 220G due to sagging of the mask. The spacer 191 may include an organic insulating material such as polyimide (PI), hexamethyldisiloxane (HMDSO), etc., and may include the same material as that of the upper insulating layer 180. The spacer 191 and the upper insulating layer 180 may be obtained through a same mask process, e.g., a process using a half-tone mask. In another embodiment, the spacer 191 may include a different material from that of the upper insulating layer 180 and the spacer 191 and the upper insulating layer 180 may be obtained through different processes.

The red organic light-emitting layer 220R may include a fluorescent material or a phosphor material emitting red visible light, the blue organic light-emitting layer 220B may include a fluorescent material or a phosphor material emitting blue visible light, and the green organic light-emitting layer 220G may include a fluorescent material or a phosphor material emitting green visible light.

The second electrode 230 may include a (semi-)transparent electrode. The second electrode 230 may include Ag, Mg, Al, Yb, Ca, Lu, Au, or a compound thereof, or may include a (semi-)transparent material such as ITO, IZO, ZnO, or $In_2O_3$. In an embodiment, the second electrode 230 may include a thin metal film including Ag and Mg.

The second electrode 230 may include a conductive material having a low work function. For example, the second electrode 230 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the second electrode 230 may further include a layer including ITO, IZO, ZnO, or $In_2O_3$ on the (semi-)transparent layer including the above material. In an embodiment, the second electrode 230 may include argentum (Ag) and magnesium (Mg). The second electrode 230 may be formed to entirely cover the display area DA (see FIG. 1). The second electrode 230 may be a common layer covering a plurality of first electrodes 210.

In FIG. 3, each of the red, blue, and green organic light-emitting layers 220R, 220B, and 220G is disposed between the first electrode 210 and the second electrode 230 to be in direct contact with the first and second electrodes 210 and 230, but one or more embodiments are not limited thereto. In another embodiment, a first functional layer may be disposed under the red, blue, and green organic light-emitting layers 220R, 220B, and 220G, and a second functional layer may be disposed over the red, blue, and green organic light-emitting layers 220R, 220B, and 220G. The first functional layer may be disposed between the first electrode 210 and the organic light-emitting layers 220R, 220B, and 220G, and may include a hole transport layer and/or a hole injection layer. The second functional layer may be disposed between the organic light-emitting layers 220R, 220B, and 220G and the second electrode 230, and may include an electron injection layer and/or an electron transport layer. Each of the first functional layer and/or the second functional layer may be integrally provided to entirely cover the display area DA (see FIG. 1) like the second electrode 230.

FIG. 3 shows that the light-emitting diodes 250R, 250B, and 250G include the organic light-emitting layers 220R, 220B, and 220G, but one or more embodiments are not limited thereto. The light-emitting diode may include an inorganic light-emitting diode including an inorganic material. The inorganic light-emitting diode may include a PN diode including inorganic material semiconductor-based materials. When a voltage is applied to the PN junction diode in forward direction, holes and electrons are injected, and energy generated by recombination of the holes and electrons is converted into light energy to emit light having a certain color. The inorganic light-emitting diode may have a width of a few to hundreds of micrometers or a few to hundreds of nanometers. In some embodiments, the light-emitting diode may include a quantum dot light-emitting diode. As described above, the emission layer in each of the light-emitting diodes 250R, 250B, and 250G may be variously modified, e.g., may include an organic material, an inorganic material, quantum dots, an organic material and quantum dots, or an inorganic material and quantum dots.

The encapsulation layer 300 may include at least one inorganic layer and at least one organic layer. For example, the encapsulation layer 300 may include a first inorganic encapsulation layer 310, a second inorganic encapsulation layer 330, and an organic encapsulation layer 320 disposed between the first inorganic encapsulation layer 310 and the second inorganic encapsulation layer 330.

The first inorganic encapsulation layer 310 and the second inorganic encapsulation layers 330 may include one or more inorganic insulating materials from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layered structure or a multi-layered structure including the above-mentioned materials. The organic encapsulation layer 320 may include a polymer-based material. The polymer-based material may include an acryl-based resin such as polymethacrylate and polyacrylic acid, an epoxy-based resin, polyimide, polyethylene, etc. In an embodiment, the organic encapsulation layer 320 may include an acrylate polymer.

The touch sensing layer 400 is disposed on the encapsulation layer 300 and generates a coordinate of a touch input.

The touch sensing layer 400 may include a touch electrode (or sensing electrode) for generating the coordinate of the touch input. The touch electrode may include a conductive pattern layer 430 that is disposed between a first insulating layer 410 and a second insulating layer 450. For example, the touch electrode may include a plurality of metal lines ML and ML' included in the conductive pattern layer 430.

The first insulating layer 410 may include an inorganic insulating material such as silicon oxide, silicon nitride, and/or silicon oxynitride.

The conductive pattern layer 430 may include molybdenum (Mo), aluminum (Al), copper (Cu), titanium (Ti), etc., and may have a single-layered or multi-layered structure including the materials stated above. In an embodiment, the conductive pattern layer 430 may have a triple-layered structure including Ti/Al/Ti.

The second insulating layer 450 may include an organic insulating layer or an inorganic insulating layer. When the second insulating layer 450 includes an organic insulating material, the organic insulating material may include an acryl-based resin, an epoxy-based resin, polyimide, polyethylene, etc.

Figure 4A:
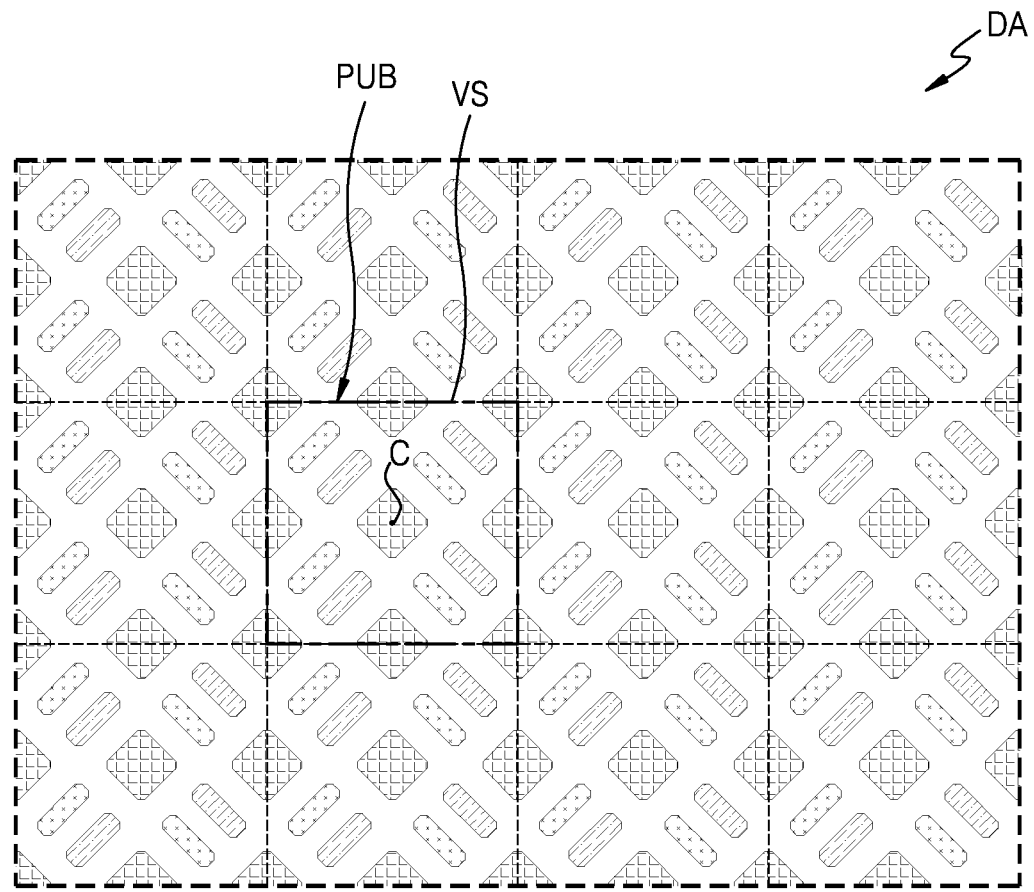
FIGS. 4A and 4B are plan views of sub-pixels in the display device according to the embodiment.
Figure 4B:
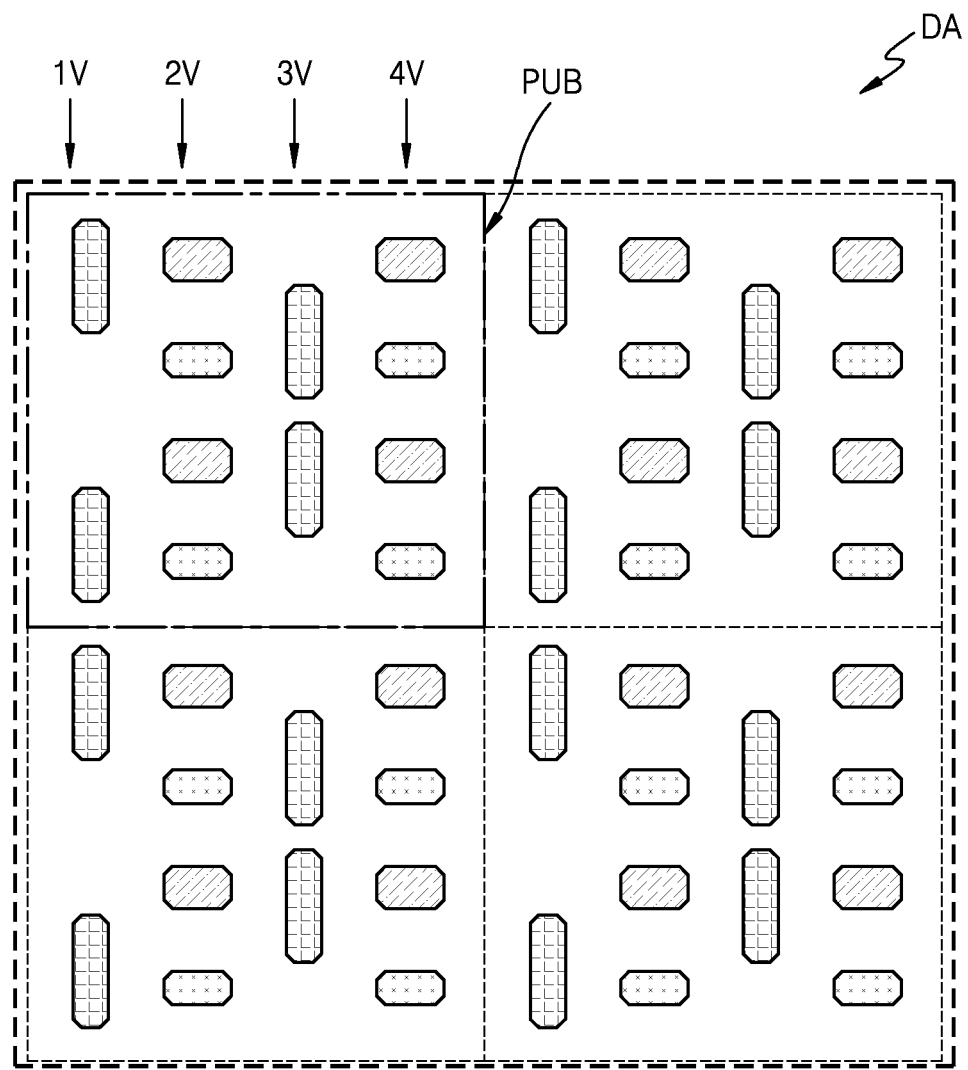
Figure 4B:
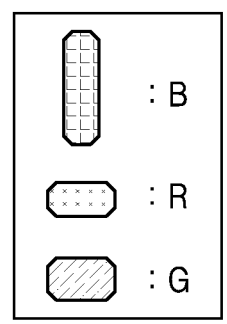

FIGS. 4A and 4B are plan views of sub-pixels in the display device according to the embodiment.

Referring to FIGS. 4A and 4B, red, blue, and green sub-pixels R, B, and G may be arranged at a certain rule in the display area DA. Referring to FIG. 4A, the blue sub-pixels B are disposed at vertices of a virtual square VS, and at sides between adjacent vertices, and at a center C of the virtual square VS.

Based on the blue sub-pixel B at the center C of the virtual square VS, the red sub-pixels R and the green sub-pixels G may be arranged in a first diagonal direction ob1 and a second diagonal direction ob2 between adjacent blue sub-pixels B. For example, one red sub-pixel R and one green sub-pixel G may be disposed between the blue sub-pixel B at the center C and the blue sub-pixel B at one vertex. Therefore, four red sub-pixels R and four green sub-pixels G may be in the virtual square VS.

The red sub-pixels R and the green sub-pixels G disposed at opposite sides of an axis passing through the center C of the virtual square VS in a y-direction may be in a line symmetry with the axis passing through the center C of the virtual squares VS as a line of symmetry.

In the display area DA, the sub-pixels disposed in the virtual square VS may be repeated along the x-direction and the y-direction. In other words, the virtual square VS corresponds to a minimum unit of arrangement of the sub-pixels (hereinafter, referred to as a pixel unit block (PUB)). The pixel unit block PUB is a virtual unit block having a certain area in which the blue sub-pixels B, the red sub-pixels R, and the green sub-pixels G are provided, and corresponds to a minimum repeated unit in the arrangement pattern of the sub-pixels in the display area. The display area DA may have a structure in which the pixel unit blocks PUB are repeatedly provided along the x-direction and the y-direction. In this embodiment, the pixel unit block PUB may include four red sub-pixels, four green sub-pixels and four blue sub-pixels.

Referring to FIG. 4B, in another embodiment, the blue sub-pixels B may be provided in a first virtual vertical line 1V and a third virtual vertical line 3V in the y-direction in the pixel unit block PUB. In each of the pixel unit blocks PUB, a gap between the blue sub-pixels B on the first virtual vertical line 1V may be greater than that of the blue sub-pixels B on the third virtual vertical line 3V.

The red sub-pixels R and the green sub-pixels G may be provided in a second virtual vertical line 2V and a fourth virtual vertical line 4V along the y-direction. The green sub-pixel G and the red sub-pixel R may be alternately provided on the second virtual vertical line 2V. Likewise, the green sub-pixel G and the red sub-pixel R may be alternately provided on the fourth virtual vertical line 4V.

Figure 5:
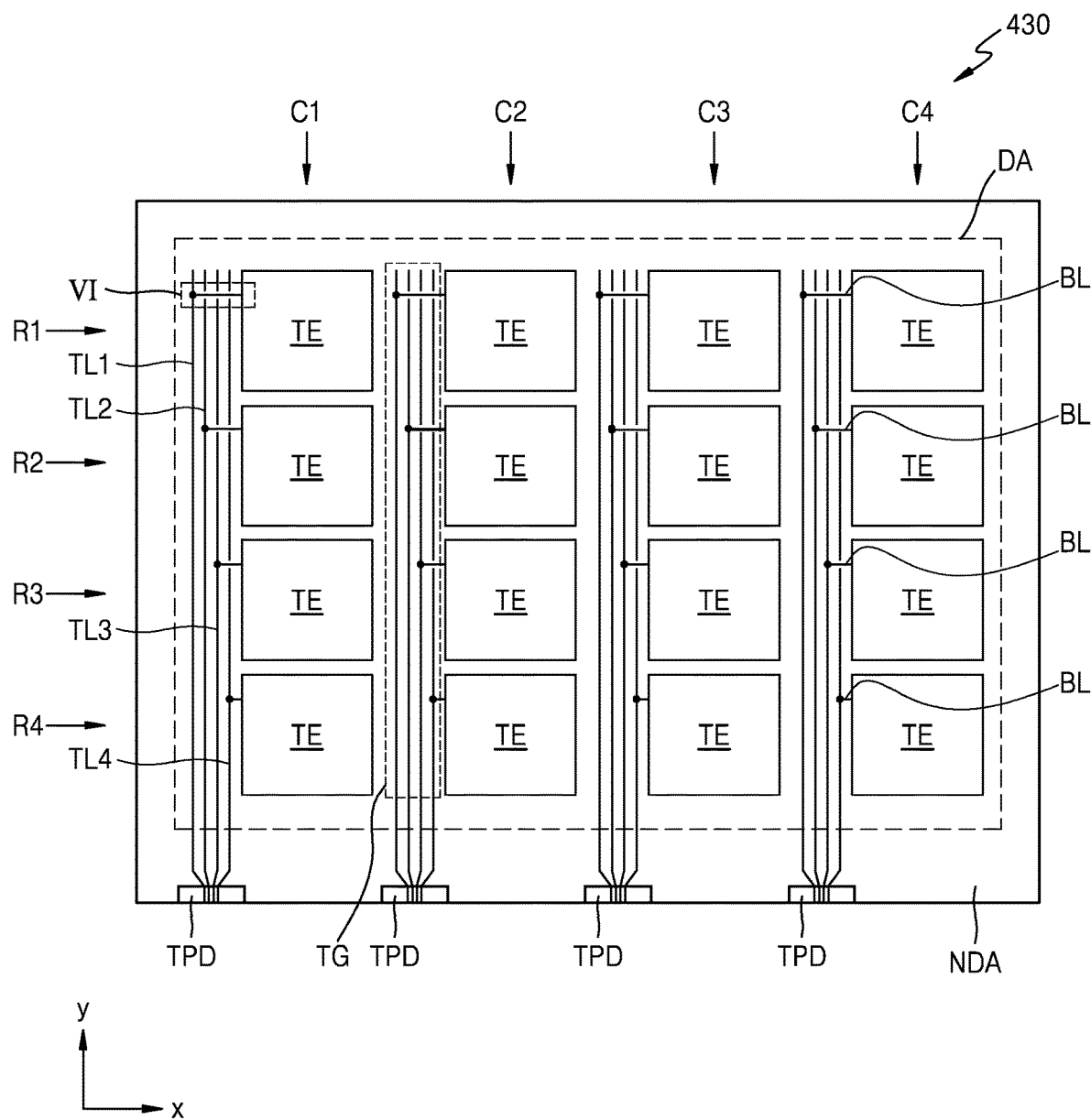
FIG. 5 is a plan view of a conductive pattern layer in a touch sensing layer of a display device according to an embodiment.
Figure 6:
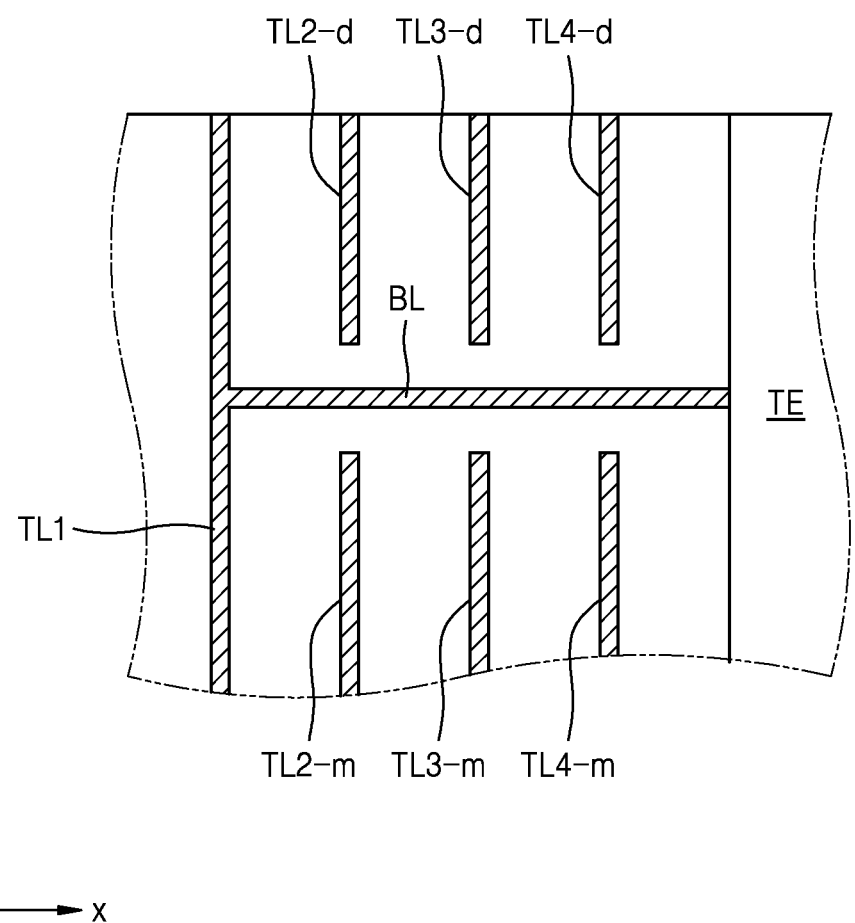
FIG. 6 is a plan view showing an enlarged view of region VI in FIG. 5.
Figure 7:
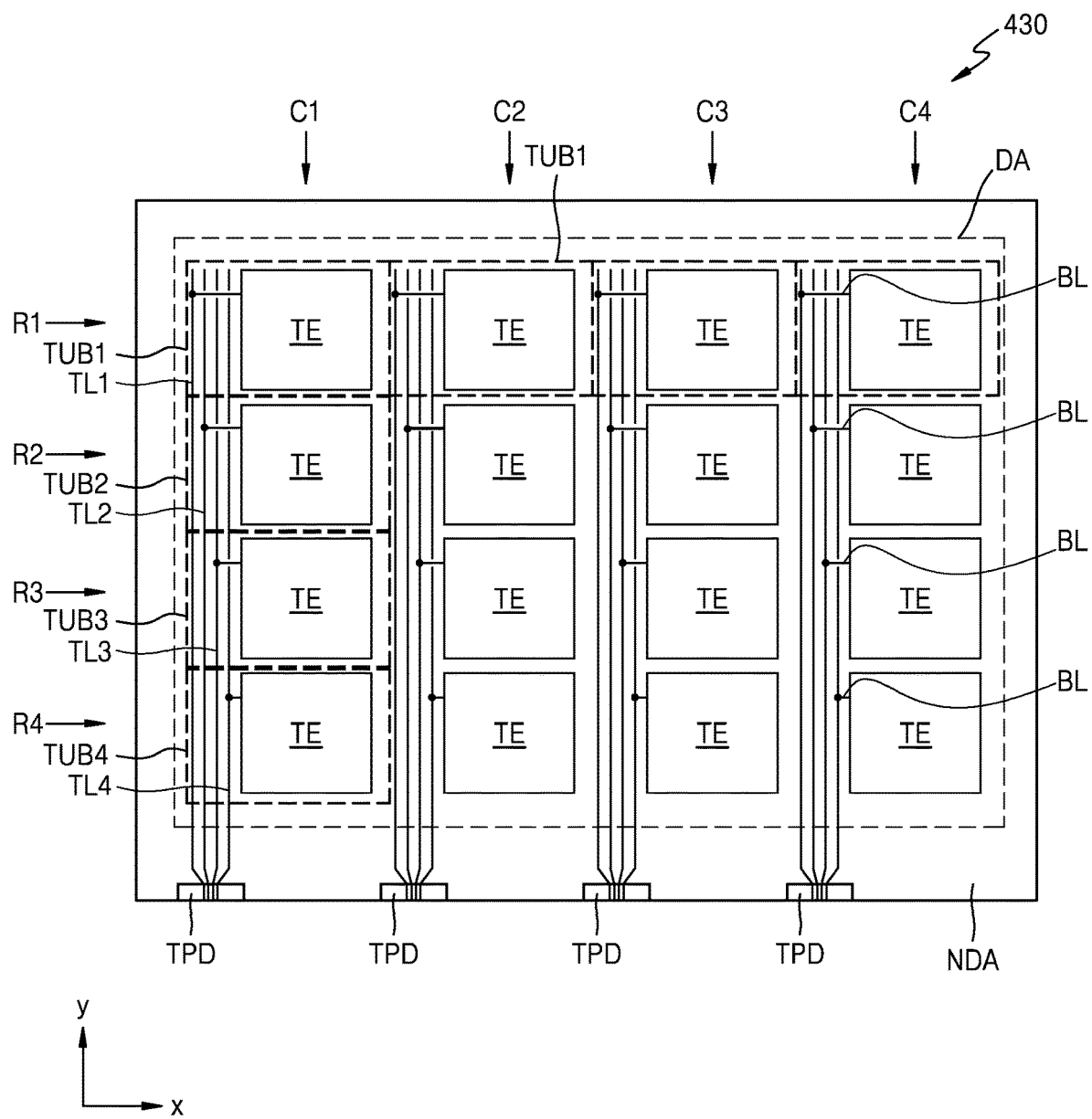
FIG. 7 is a plan view of a touch pattern unit block in a conductive pattern layer of FIG. 7.

FIG. 5 is a plan view showing a conductive pattern layer of a touch sensing layer in the display device according to an embodiment, FIG. 6 is a plan view showing an enlarged view of a region VI in FIG. 5, and FIG. 7 is a plan view of a touch pattern unit block of FIG. 5.

The conductive pattern layer 430 described above with reference to FIG. 3 may include a conductive pattern including touch electrodes TE and trace lines as shown in FIG. 5. The touch electrodes TE according to the embodiment may detect a touch input location in a self-capacitance type. A charging signal and a discharging signal may be applied to the touch electrode TE through a trace line connected to the touch electrode TE, and, when a touch event caused by a finger or an object such as a stylus pen occurs, distortion may occur in the charging signal or the discharging signal, and a coordinate of the touch (touch input location) may be detected by using the distorted signals.

The touch electrodes TE may be provided in a matrix configuration along the x-direction (row direction, first direction) and the y-direction (column direction, second direction). For example, the touch electrodes TE may be provided as a matrix including N rows and M columns. Here, N and M are natural numbers which may be the same as or different from each other. Hereinafter, for convenience of description, FIG. 5 shows the touch electrodes TE arranged as a matrix with four rows and four columns, but N and M may be natural numbers ranging from tens to hundreds. The touch electrode TE may have a polygonal shape, for example, FIG. 5 shows the touch electrode TE having the square shape.

Trace lines TL1, TL2, TL3, and TL4 extending in the y-direction may be provided at one sides of the touch electrodes TE of j-th column (Cj, j=1, 2, 3, 4). The trace lines TL1, TL2, TL3, and TL4 at one side of the j-th column Cj are disposed adjacent to each other to make one group TG.

The conductive pattern of the conductive pattern layer 430 may have a structure in which the group TG of the trace lines TL1, TL2, TL3, and TL4 and the column Cj of the touch electrodes TE are alternately arranged in the x-direction in the display area DA. The number of trace lines TL1, TL2, TL3, and TL4 at each group TG may be the same as the number of touch electrodes TE included in the j-th column Cj and may be equal to the number N of the rows of the touch electrodes TE. The trace lines TL1, TL2, TL3, and TL4 of each group TG may extend toward a touch pad TPD in the non-display area NDA.

The trace lines TL1, TL2, TL3, and TL4 at one side of the j-th column Cj may be electrically connected to the touch electrodes TE in the j-th column Cj, respectively. In the j-th column Cj, the touch electrode TE at an i-th row (Ri, i=1, 2, 3, 4) may be electrically connected to an i-th trace line TLi via a bridge line BL. In the j-th column Cj, the touch electrode TE at a first row R1 may be electrically connected to the first trace line TL1 via the bridge line BL, and the touch electrode TE at a second row R2 may be electrically connected to the second trace line TL2 via the bridge line BL. Likewise, the touch electrode TE at a third row R3 and the j-th column Cj may be electrically connected to the third trace line TL3 in the group TG adjacent to the j-th column Cj, and the touch electrode TE at a fourth row R4 and the j-th column Cj may be electrically connected to the fourth trace line TL4 in the group TG adjacent to the j-th column Cj.

The trace lines TL1, TL2, TL3, and TL4 and the touch electrodes TE may be electrically connected to each other via the bridge lines BL. The bridge line BL may be disposed on the same layer as those of the touch electrodes TE and the trace lines TL1, TL2, TL3, and TL4, and may include the same material as that of the touch electrodes TE and the trace lines TL1, TL2, TL3, and TL4. For example, the bridge lines BL, the touch electrodes TE, and the trace lines TL1, TL2, TL3, and TL4 may be on the first insulating layer 410 (see FIG. 3) described above with reference to FIG. 3 and may be covered by the second insulating layer 450 (see FIG. 3). The bridge lines BL, the touch electrodes TE, and the trace lines TL1, TL2, TL3, and TL4 may include molybdenum (Mo), aluminum (Al), copper (Cu), titanium (Ti), etc. In an embodiment, the bridge lines BL, the touch electrodes TE, and the trace lines TL1, TL2, TL3, and TL4 may each have a triple-layered structure including Ti/Al/Ti.

The bridge lines BL may extend in a direction, e.g., in the x-direction, intersecting with the trace lines TL1, TL2, TL3, and TL4. Some of the trace lines TL1, TL2, TL3, and TL4 may have disconnected parts based on the bridge line BL.

From among the trace lines TL1, TL2, TL3, and TL4 at one side of the j-th column Cj, an i-th trace line TLi (i=1, 2, 3, 4) may be electrically connected to the touch electrode TE at the i-th row Ri and the j-th column Cj via the bridge line BL. Here, other trace lines (e.g., i+1st to n-th trace lines) between the i-th trace line TLi and the touch electrode TE may include disconnected parts in regions corresponding to the bridge line BL to prevent a short circuit between touch electrodes TE and/or the trace lines TL1, TL2, TL3, and TL4.

In an embodiment, referring to FIG. 6, the first trace line TL1 may be electrically connected to the touch electrode TE at the first row R1 and the j-th column Cj via the bridge line BL. As described above, the first trace line TL1, the bridge line BL, and the touch electrode TE are disposed on the same layer, the bridge line BL connected to the first trace line TL1 has to be electrically insulated from the other trace lines to prevent a short circuit between touch electrodes TE and/or the trace lines TL1, TL2, TL3, and TL4. To do this, each of the trace lines disposed between the first trace line TL1 and the touch electrode TE, e.g., the second to fourth trace lines TL2, TL3, and TL4, may have a portion disconnected from each other. For example, as shown in FIG. 6, the second to fourth trace lines TL2, TL3, and TL4 may respectively include main portions (or first portions, TL2-m, TL3-m, and TL4-m) and dummy portions (or second portions, TL2-d, TL3-d, and TL4-d).

The conductive pattern of the display area DA described above with reference to FIG. 5 may include touch pattern unit blocks TUBq (q=1, 2, 3, 4) that are repeatedly provided along the i-th row Ri as shown in FIG. 7. The touch pattern unit block TUBq is a virtual unit block having a certain size (area) including at least a part of the touch electrode TE and some parts of the trace lines TL1, TL2, TL3, and TL4, and may correspond to a minimum repeated unit in the x-direction, e.g., the row direction.

The conductive pattern of the conductive pattern layer 430 includes a structure in which the touch pattern unit blocks TUBq (q=1, 2, 3, 4) are repeatedly provided in the x-direction. For example, the conductive pattern may include a structure in which first touch pattern unit blocks TUB1 are repeatedly provided along the x-direction, a structure in which second touch pattern unit blocks TUB2 are repeatedly provided along the x-direction, a structure in which third touch pattern unit blocks TUB3 are repeatedly provided along the x-direction, and a structure in which fourth touch pattern unit blocks TUB4 are repeatedly provided along the x-direction.

As shown in FIG. 7, the location of the bridge line BL connecting the touch electrode TE and the trace line included in one of adjacent first touch pattern unit blocks TUB1 may be the same as that of the bridge line BL connecting the touch electrode TE and the trace line included in another one of the adjacent first touch pattern unit blocks TUB1. For example, a location, a length, and a connection point of the bridge line BL included in one first touch pattern unit block TUB1 may be the same as those of the bridge line BL in another first touch pattern unit block TUB1. The touch electrode TE included in one first touch pattern unit block TUB1 and the touch electrode TE included in another first touch pattern unit block TUB1 are disposed at the same row but are electrically connected to the first trace lines TL1 in different groups TG.

The touch pattern unit block TUBq may correspond to a minimum unit of capturing image for performing a defect inspection of a conductive pattern. The defect of the conductive pattern in the display area DA may be detected by capturing images corresponding to the touch pattern unit blocks TUBq and comparing the captured images. Here, the minimum unit of capturing image for the defect inspection may correspond to the touch pattern unit block TUBq.

The touch pattern unit block TUBq does not have the same structure as those of the other touch pattern unit blocks arranged along the y-direction. For example, one of first to fourth touch pattern unit blocks TUB1, TUB2, TUB3, and TUB4 may have a different structure each other. For example, a connection point, a length, and a shape of the bridge line BL in the first touch pattern unit block TUB1 may be different from those of the bridge line BL in each of the second to fourth touch pattern unit blocks TUB2, TUB3, and TUB4. Therefore, the above defect inspection may be performed by comparing the captured images in the same row but may not be performed by comparing the captured images in different rows.

Figure 8:
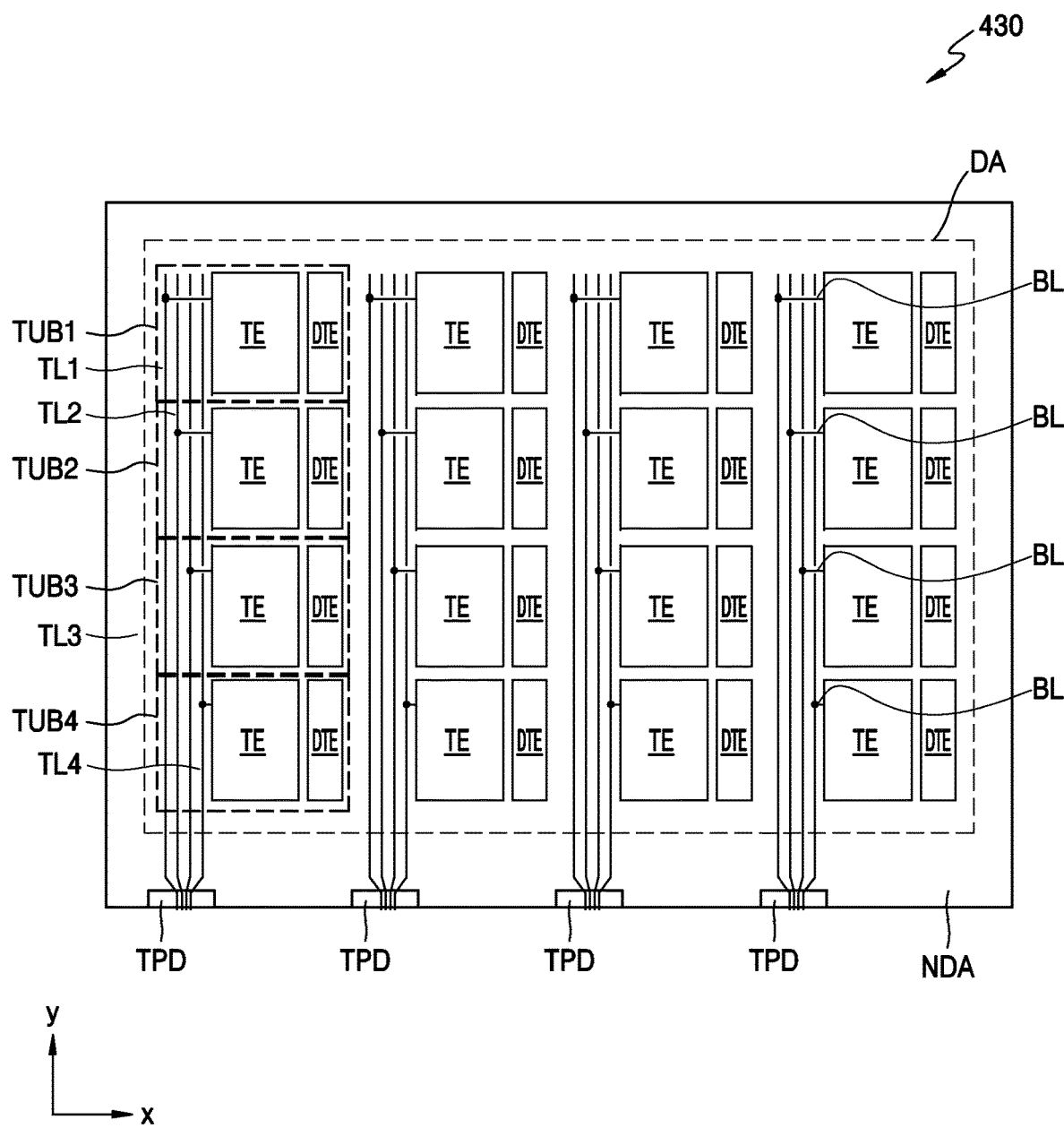
FIG. 8 is a plan view of a conductive pattern layer in a touch sensing layer of a display device according to an embodiment.

FIG. 8 is a plan view of a conductive pattern layer in the touch sensing layer 430 of a display device according to an embodiment.

Referring to FIG. 8, the conductive pattern of the conductive pattern layer 430 may have a structure in which first to fourth touch pattern unit blocks TUB1, TUB2, TUB3, and TUB4 are repeatedly arranged along the x-direction as described above with reference to FIGS. 5 to 7. However, the conductive pattern layer 430 of FIG. 8 is different in that the touch pattern unit block TUBq (q=1, 2, 3, 4) further includes a dummy touch electrode DTE, and the other characteristics are the same as those of the above descriptions. Hereinafter, differences will be described below.

The touch pattern unit blocks TUBq (q=1, 2, 3, 4) may each include parts of the trace lines TL1, TL2, TL3, and TL4, the bridge line BL, at least a part of the touch electrode TE, and the dummy touch electrode DTE. Each dummy touch electrode DTE is separated and spaced apart from the touch electrode TE and may be at opposite side of the trace lines TL1, TL2, TL3, and TL4 with the touch electrode TE disposed therebetween.

Figure 9:
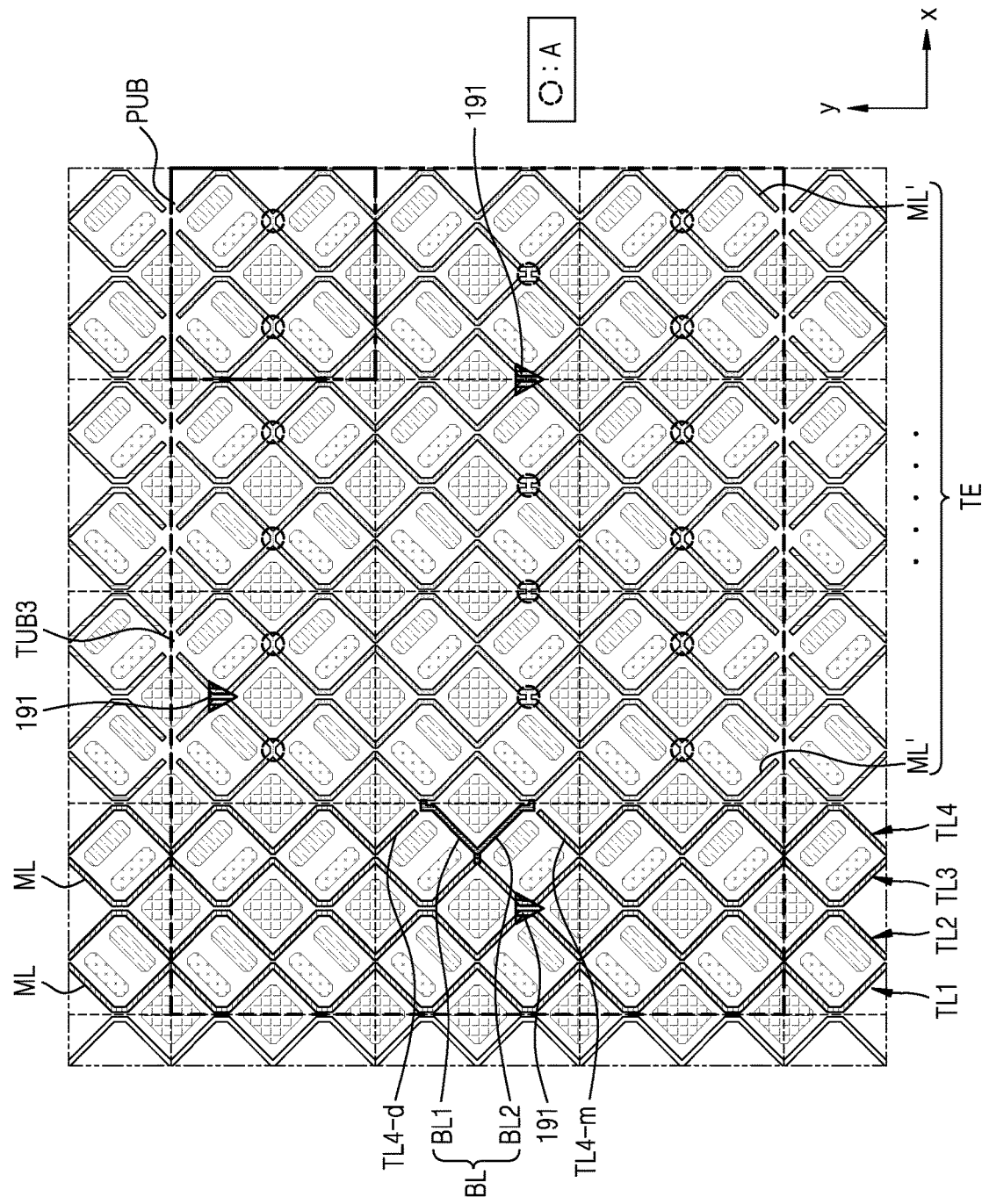
FIG. 9 is a plan view showing an enlarged view of one touch pattern unit block included in a conductive pattern of an input sensing layer according to an embodiment.

FIG. 9 is a plan view showing an enlarged view of one touch pattern unit block TUBq included in a conductive pattern of an input sensing layer according to an embodiment. FIG. 9 shows the third touch pattern unit block TUB3 of FIG. 7 for convenience of description.

Referring to FIG. 9, the touch pattern unit block TUB3 may have a size corresponding to integer multiple of the pixel unit block PUB. In other words, the touch pattern unit block TUB3 may include pixel unit blocks PUB in K rows and L columns. Here, K denotes the number of rows of the pixel unit blocks included in the touch pattern unit block TUB3 and is a natural number, and L denotes the number of columns of the pixel unit blocks included in the touch pattern unit block TUB3 and is a natural number. For convenience of description, FIG. 9 shows that the third touch pattern unit block TUB3 includes twelve pixel unit blocks PUB, 3×4 pixel unit blocks PUB, but one or more embodiments are not limited thereto. In another embodiment, K and L may be natural numbers ranging from tens to hundreds.

In a comparative example, when the touch pattern unit block, e.g., the third touch pattern unit block TUB3, does not have a size corresponding to the integer multiple of the pixel unit block PUB, arrangement of the sub-pixels varies in every touch pattern unit block. Thus, as described above, there may be a distortion in the captured image for inspecting defects in the conductive pattern. However, according to the embodiment, because the touch pattern unit block TUBq has a size corresponding to an integer multiple of the pixel unit block PUB along the row direction and the column direction, the arrangement of the sub-pixels in each touch pattern unit block TUBq is consistent, and thus, a precision in the defect inspection may be improved.

The touch pattern unit block TUBq may include some parts of the trace lines TL1, TL2, TL3, and TL4. With regard to this, FIG. 9 shows that some parts of the trace lines TL1, TL2, TL3, and TL4 are disposed in a boundary of the third touch pattern unit block PUB3. Some parts of the trace lines TL1, TL2, TL3, and TL4 may be in some of the K×L pixel unit blocks PUB. With regard to this, FIG. 9 shows that some of the trace lines TL1, TL2, TL3, and TL4 are in regions corresponding to the pixel unit blocks PUB in the first column.

The trace lines TL1, TL2, TL3, and TL4 may respectively include metal lines ML (hereinafter, referred to as first metal lines) that are spaced apart from one another and substantially extend in the y-direction. Each of the first metal lines ML may be disposed between the sub-pixels B, G, and R.

Each of the first metal lines ML of FIG. 9 may correspond to the first to fourth trace lines TL1, TL2, TL3, and TL4. The first metal lines ML corresponding to the first to fourth trace lines TL1, TL2, TL3, and TL4 may extend in the y-direction in zigzag configurations as shown in FIG. 9. In other words, each of the first to fourth trace lines TL1, TL2, TL3, and TL4 may substantially extend in the y-direction to have the zigzag configuration.

The first metal lines ML corresponding to the first to fourth trace lines TL1, TL2, TL3, and TL4 may not be within a boundary of any one touch pattern unit block (e.g., TUB3), but may continuously extend towards neighboring touch pattern unit blocks (e.g., TUB1, TUB2, and TUB4) in the y-direction and detailed configurations thereof are described above with reference to FIG. 5.

The first metal lines ML respectively extend in the y-direction while being spaced apart from one another electrically and structurally, but metal lines ML' (hereinafter, referred to as second metal lines) corresponding to the touch electrodes TE extend in the y-direction, but may be electrically and structurally connected to one another to form the touch electrodes TE. Because the second metal lines ML' are connected to one another in region A, the second metal lines ML' corresponding to the touch electrodes TE may be electrically integrated with one another.

The touch electrode TE may be electrically connected to the trace line via the bridge line BL. FIG. 9 shows that the bridge line BL includes bridge metal lines BL1 and BL2.

The bridge metal lines BL1 and BL2 may connect the third trace line TL3 to the second metal line ML' corresponding to the touch electrode TE and may be integrally provided with the third trace line and the second metal line ML'. The trace line disposed between the third trace line TL3 and the touch electrode TE, e.g., the fourth trace line TL4, may include the main portion TL4-m and the dummy portion TL4-d which are disconnected from each other in a region corresponding to the bridge line BL as described above with reference to FIGS. 5 and 6.

Spacers 191 are disposed in the display area DA. The spacers 191 may be disposed in certain locations within the boundary of the touch pattern unit block TUBq, e.g., the third touch pattern unit block TUB3 as shown in FIG. 9.

At least one spacer 191 may overlap the trace line. For example, as shown in FIG. 9, the spacer 191 may overlap two first metal lines ML corresponding to the second and third trace lines TL2 and TL3. Another spacer 191 may overlap at least one of the second metal lines ML' of the touch electrode TE adjacent to each other.

In the touch pattern unit block TUB, the number of metal lines extending in the y-direction, e.g., the first and second metal lines ML and ML', may correspond to multiplication of "the number of metal lines passing through one pixel unit block PUB" and the number L described above. In an embodiment, referring to FIG. 9, because the number of metal lines ML and ML' passing through one pixel unit block PUB is 4 and 3×4 pixel unit blocks PUB are disposed in the third touch pattern unit block TUB3, the number of metal lines extending in the y-direction in the third touch pattern unit block TUB3 may be 16.

Figure 10:
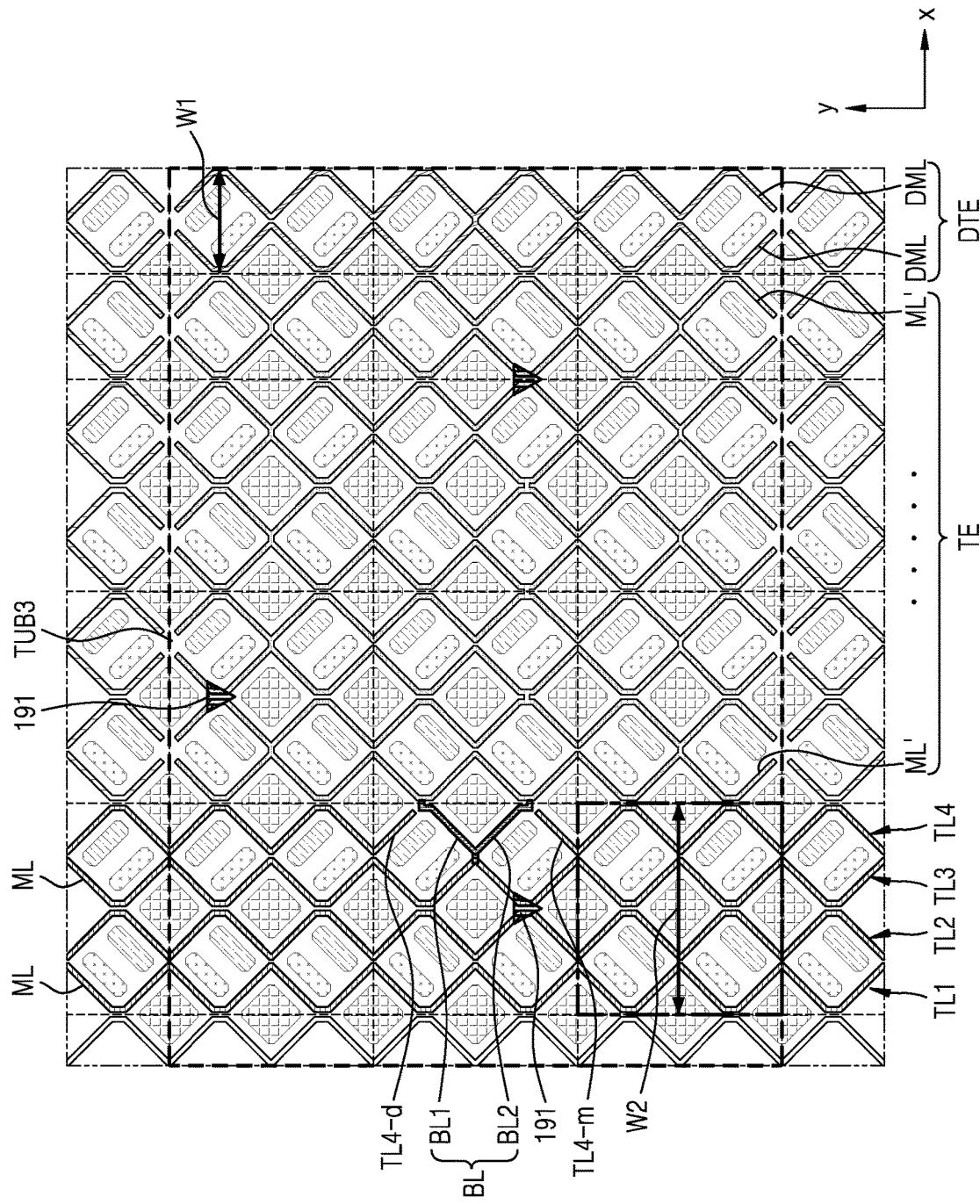
FIG. 10 is a plan view showing an enlarged view of one touch pattern unit block included in a conductive pattern of an input sensing layer according to an embodiment.

FIG. 10 is a plan view showing an enlarged view of one touch pattern unit block included in a conductive pattern of an input sensing layer according to an embodiment. For convenience of description, FIG. 10 describes that the third touch pattern unit block TUB3 is enlarged.

The embodiment of FIG. 10 is the same as the above embodiment of FIG. 9 except that the touch pattern unit block, e.g., the third touch pattern unit block TUB3, includes the dummy touch electrode DTE, and hereinafter, differences will be described below.

The dummy touch electrode DTE may include at least one metal line (hereinafter, referred to as a dummy metal line DML), and in an embodiment, FIG. 10 shows two dummy metal lines DML. The dummy metal line DML of the dummy touch electrode DTE is not electrically and structurally connected to the second metal line ML' of the touch electrode TE. For example, the dummy metal line DML of the dummy touch electrode DTE may be spaced apart from the second metal line ML' of the touch electrode TE.

A width of the dummy touch electrode DTE (e.g., a width in the x-direction, W1) may be less than a width of the pixel unit block PUB (e.g., a width in the x-direction, W2). In some embodiments, the number of the dummy metal lines DML of the dummy touch electrode DTE may be less than that of the metal lines ML or ML' passing through the pixel unit block PUB. With regard to this, FIG. 9 shows that the number of metal lines ML or ML' passing through the pixel unit block PUB is four, and the dummy touch electrode DTE includes two dummy metal lines DML.

Figure 11:
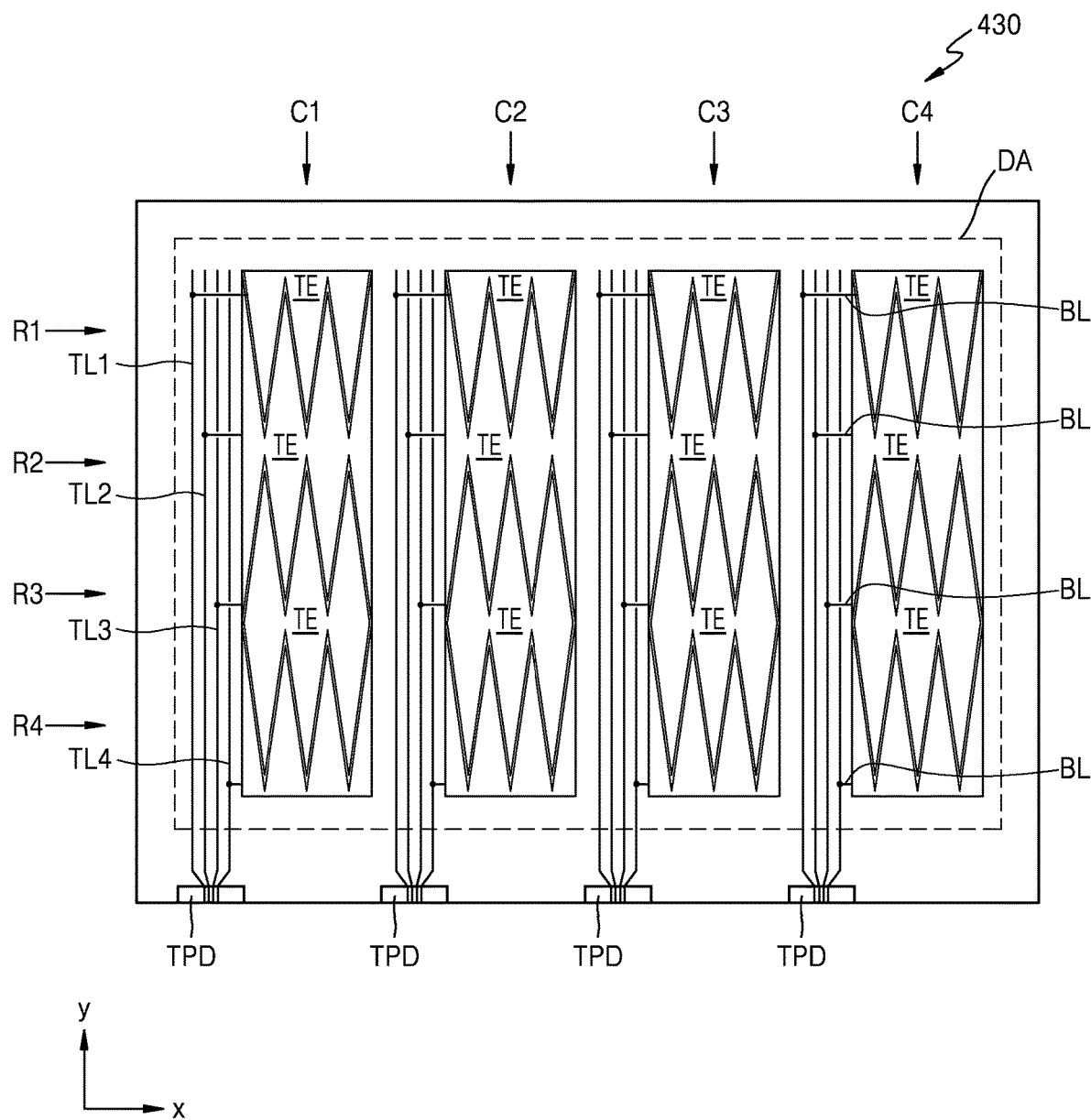
FIG. 11 is a plan view of a conductive pattern layer in a touch sensing layer of a display device according to an embodiment.
Figure 12:
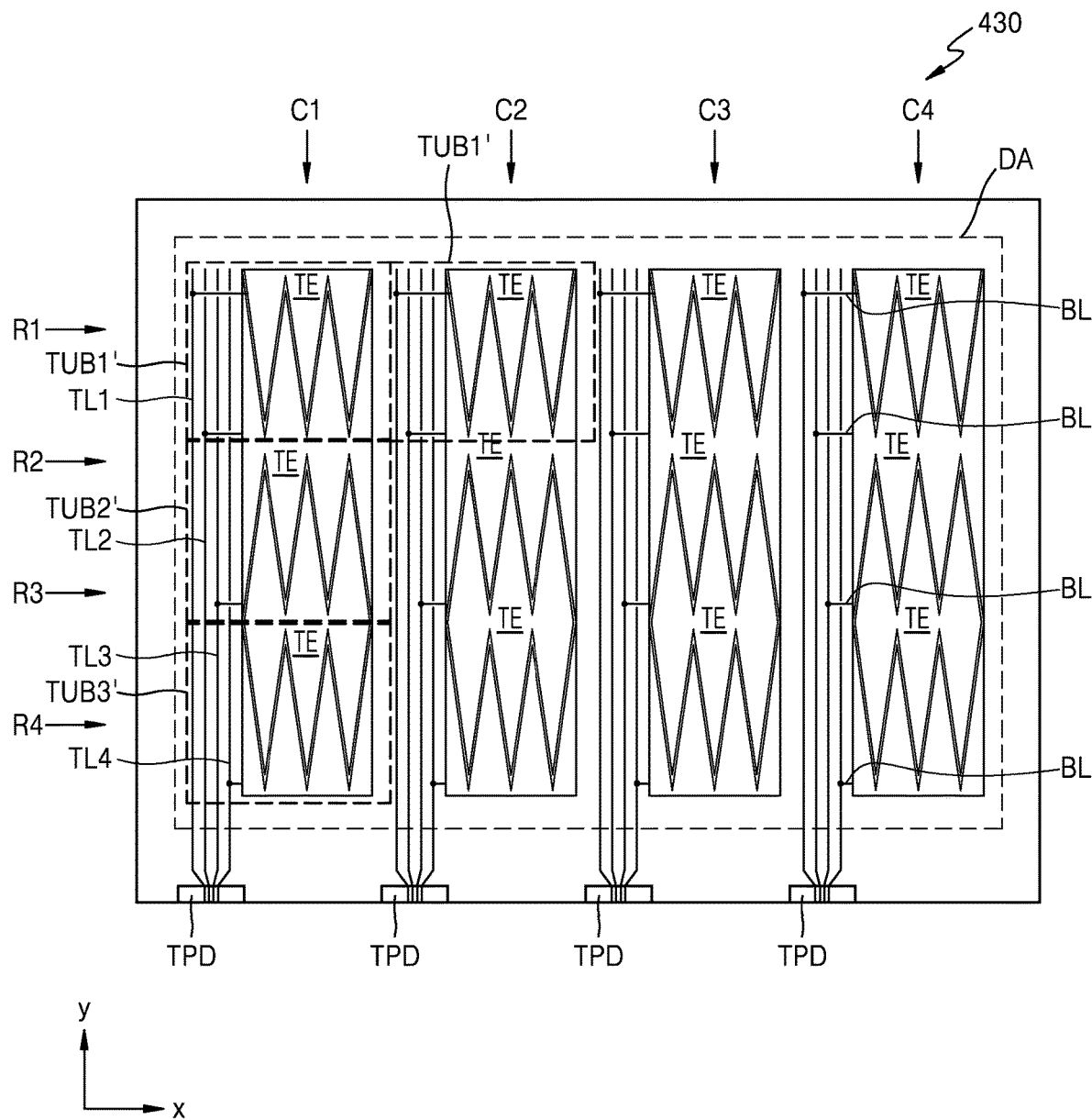
FIG. 12 is a plan view of a touch pattern unit block in a conductive pattern layer of FIG. 11.

FIG. 11 is a plan view of a conductive pattern layer in a touch sensing layer of a display device according to an embodiment, and FIG. 12 is a plan view of the touch pattern unit block in the conductive pattern layer shown in FIG. 11.

FIGS. 5 to 10 show that edge of the touch electrode TE has a substantially square shape and the touch pattern unit block TUBq (q=1, 2, 3, 4) includes one touch electrode TE, but one or more embodiments are not limited thereto. Referring to FIGS. 11 and 12, the touch electrode TE may have a polygonal shape having zigzag edges, and a touch pattern unit block TUBq' may include some parts of two neighboring touch electrodes TE. The other characteristics other than the above characteristic are the same as those of the embodiment described above with reference to FIGS. 5 to 7, and hereinafter, differences will be described below.

The touch electrode TE may have protruded parts and retracted parts in one direction (e.g., y-direction) to have the zigzag edges. In two adjacent touch electrodes TE in the y-direction, the protruded part of one touch electrode TE may correspond to the retracted part of another touch electrode TE. As described above, two adjacent touch electrodes TE may have interspersed structure.

The touch electrodes TE are provided as a matrix including N rows and M columns, and as described above, the touch electrodes TE adjacent to each other in the y-direction may have the interspersed structure. Hereinafter, for convenience of description, FIG. 10 shows the touch electrodes TE in four rows and four columns, but N and M may be natural numbers ranging from tens to hundreds. When the touch electrode TE has the zigzag edges described above, the touch electrodes TE in the first row R1 and the fourth row R4 may have shapes and/or sizes corresponding to halves the touch electrodes TE in the second row R2 and the third row R3.

As described above with reference to FIG. 5, the trace lines TL1, TL2, TL3, and TL4 extending in the y-direction may be provided at one sides of the touch electrodes TE of j-th columns (Cj, j=1, 2, 3, 4).

As shown in FIG. 12, any one of the touch pattern unit blocks TUBq' (q'=1, 2, 3) may include some parts of two adjacent touch electrodes TE. For example, the touch pattern unit block TUBq' (q'=1, 2, 3) may include some parts of the touch electrode TE in the i-th row Ri and the touch electrode TE in an i+1st row (Ri+1). For example, the first touch pattern unit block TUB1' may include some parts of the touch electrode TE in the first row R1 and the touch electrode TE in the second row R2. The second touch pattern unit block TUB2' may include some parts of the touch electrode TE in the second row R2 and the touch electrode TE in the third row R3. The third touch pattern unit block TUB3' may include some parts of the touch electrode TE in the third row R3 and the touch electrode TE in the fourth row R4.

The conductive pattern of the conductive pattern layer 430 may have a structure in which the touch pattern unit blocks TUBq' (q'=1, 2, 3) are repeatedly provided along the x-direction, as described above. As shown in FIG. 12, the conductive pattern may have a structure in which the first touch pattern unit blocks TUB1' are repeatedly provided along the x-direction, a structure in which the second touch pattern unit blocks TUB2' are repeatedly provided along the x-direction, and a structure in which the third touch pattern unit blocks TUB3' are repeatedly provided along the x-direction.

As described above, at one sides of the touch electrodes TE in the j-th column Cj (j=1, 2, 3, 4), the group TG including the trace lines TL1, TL2, TL3, and TL4 that are electrically connected to the corresponding column is provided. Therefore, the location of the bridge line BL connecting the touch electrode TE and the trace line included in one of adjacent first touch pattern unit blocks TUB1' may be the same as that of the bridge line BL connecting the touch electrode TE and the trace line included in another one of the adjacent first touch pattern unit blocks TUB1'. Here, the touch electrode TE included in each of the first touch pattern unit blocks TUB1' is disposed at the same row but is connected to a different trace line from one another.

Figure 13:
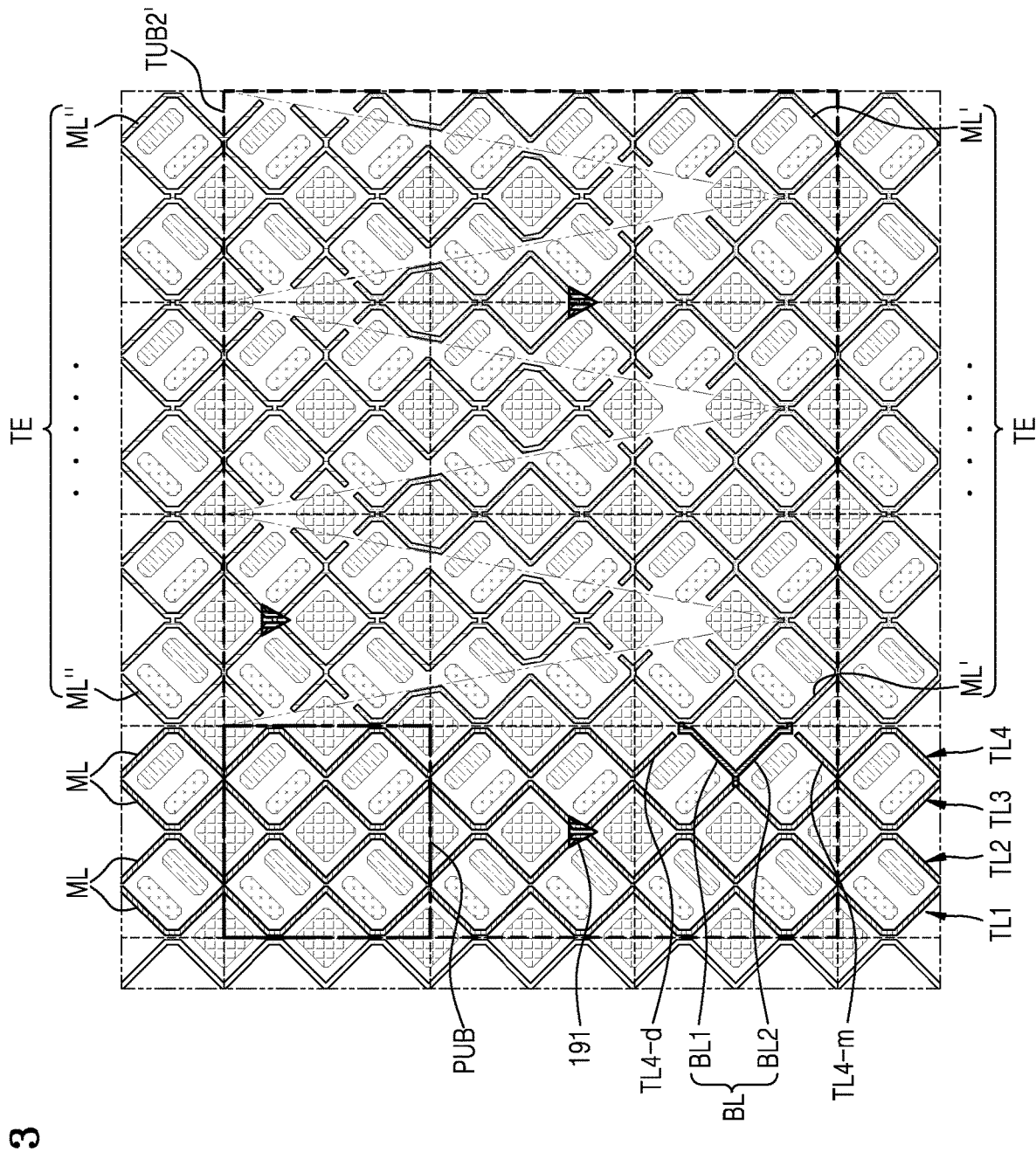
FIG. 13 is a plan view showing an enlarged view of one touch pattern unit block included in a conductive pattern of an input sensing layer according to an embodiment.
Figure 14:
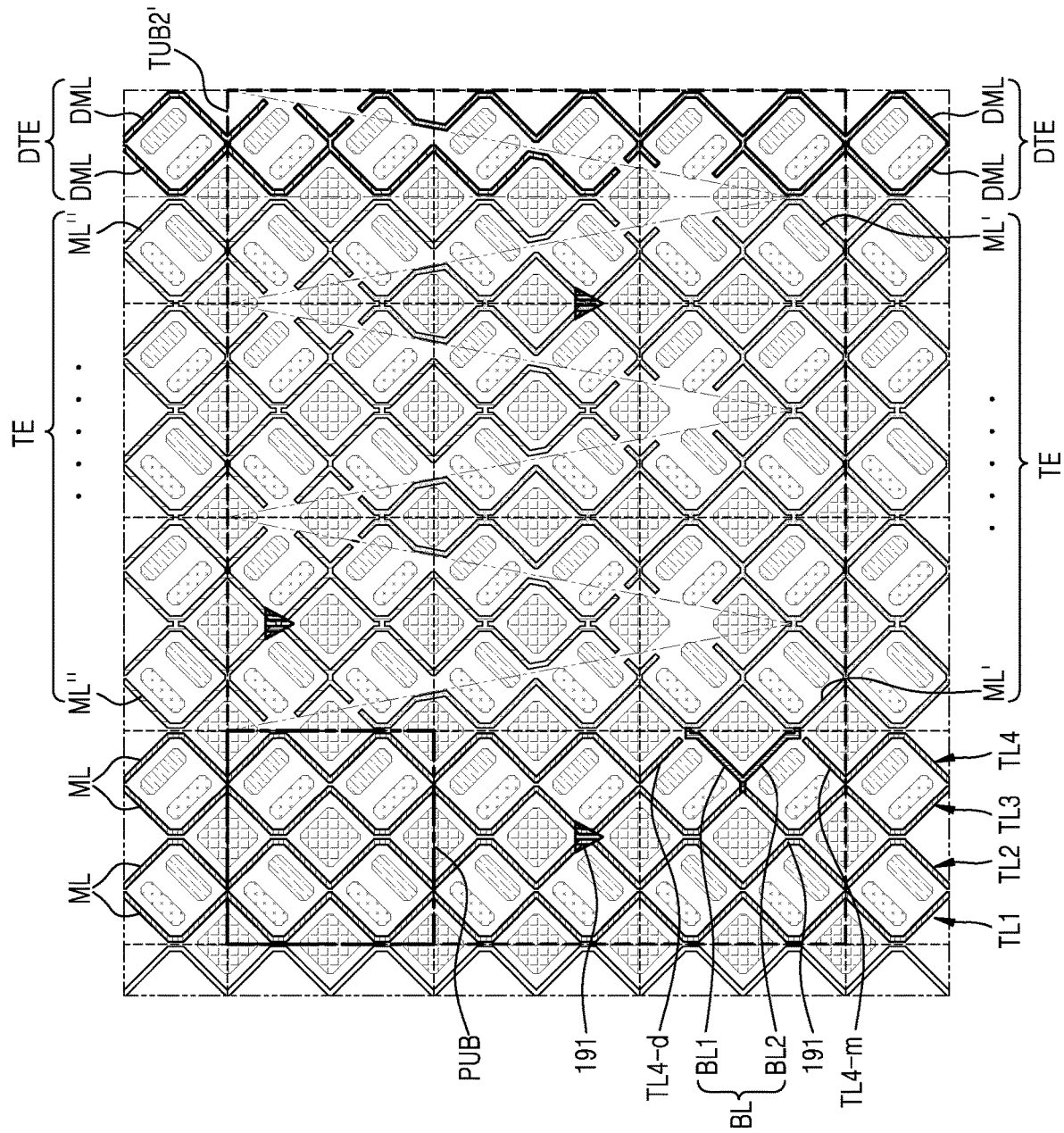
FIG. 14 is a plan view showing an enlarged view of one touch pattern unit block included in a conductive pattern of an input sensing layer according to an embodiment.

FIGS. 13 and 14 are plan views showing an enlarged view of one touch pattern unit block included in a conductive pattern of an input sensing layer according to an embodiment. For convenience of description, FIGS. 13 and 14 illustrate the second touch pattern unit block TUB2' shown in FIG. 12.

Referring to FIG. 13, the touch pattern unit block, e.g., the second touch pattern unit block TUB2', may have a size corresponding to an integer multiple of the pixel unit block PUB. For example, the touch pattern unit block TUBq may include K×L pixel unit blocks PUB. Here, K denotes the number of rows of the pixel unit blocks included in the touch pattern unit block and is a natural number, and L denotes the number of columns of the pixel unit blocks included in the touch pattern unit block and is a natural number. For convenience of description, like in FIG. 9, FIG. 13 shows that the second touch pattern unit block TUB2' includes 3×4 pixel unit blocks PUB, but one or more embodiments are not limited thereto. K and L may be natural numbers ranging from tens to hundreds.

The touch pattern unit block TUB' may include some parts of the trace lines TL1, TL2, TL3, and TL4. Regarding this, FIGS. 13 and 14 show that some parts of the trace lines TL1, TL2, TL3, and TL4 are in a boundary of the second touch pattern unit block TUB2'. Some parts of the trace lines TL1, TL2, TL3, and TL4 may be in some of the K×L pixel unit blocks PUB. With regard to this, FIGS. 13 and 14 show that some of the trace lines TL1, TL2, TL3, and TL4 are in regions corresponding to the pixel unit blocks PUB in the first column.

The trace lines TL1, TL2, TL3, and TL4 may respectively include first metal lines ML substantially extending along the y-direction while being spaced apart from one another along the x-direction. The first metal lines ML may respectively correspond to the first to fourth trace lines TL1, TL2, TL3, and TL4 and may substantially extend along the y-direction to have the zigzags configuration as described above.

The first metal lines ML respectively extend in the y-direction while being spaced apart from one another electrically and structurally, but metal lines ML' and ML" corresponding to the touch electrodes TE may be electrically and structurally connected to one another.

Because the second touch pattern unit block TUB2' includes some parts of the two touch electrodes TE that are separated from each other, the second metal lines ML' corresponding to one touch electrode TE in the second touch pattern unit block TUB2' and the metal lines ML" (hereinafter, referred to third metal lines) corresponding to another touch electrode TE may be spaced apart from each other. The second metal lines ML' are connected to one another and the third metal lines ML" are connected to one another, but the second metal lines ML' and the third metal lines ML" may be spaced apart and separated from each other.

In the second touch pattern unit block TUB2' of FIG. 13, one touch electrode TE may be connected to the third trace line TL3 via the bridge line BL. The trace line between the third trace line TL3 and the corresponding touch electrode TE, e.g., the fourth trace line TL4, may include a main portion TL4-m and a dummy portion TL4-d disconnected from each other in a region corresponding to the bridge line BL as described above.

FIG. 13 shows that the touch pattern unit block, e.g., the second touch pattern unit block TUB2', includes some parts of the touch electrodes TE, the bridge line BL, and some parts of the first to fourth trace lines TL1, TL2, TL3, and TL4, but one or more embodiments are not limited thereto. The touch pattern unit block may include the dummy touch electrode DTE.

With regard to this, FIG. 14 shows that the second touch pattern unit block TUB2' includes a part of the dummy touch electrode DTE.

The dummy touch electrode DTE may include at least one dummy metal line DML. The number of dummy metal lines DML included in one dummy touch electrode DTE may be less than the number of metal lines ML or ML' passing through the pixel unit block PUB. With regard to this, FIG. 14 shows two dummy metal lines DML.

The dummy metal lines DML of the dummy touch electrode DTE may not be electrically and structurally connected to the second and third metal lines ML' and ML" of the touch electrode TE. For example, the dummy metal line DML of the dummy touch electrode DTE may be spaced apart from the second metal line ML' of the touch electrode TE and the third metal line ML".

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a display area in which a plurality of sub-pixels are arranged; and
   a touch sensing layer, the touch sensing layer comprising:
   a plurality of island shaped touch electrodes arranged in a row direction and a column direction in the display area, the plurality of island shaped touch electrodes being spaced apart from each other in the row direction and the column direction in a plan view, and
   a plurality of trace lines electrically connected to the plurality of touch electrodes, respectively, and extending in the column direction in the display area,
   wherein each of the plurality of island shaped touch electrodes has a zigzag shaped edge and comprises a plurality of metal lines,
   wherein the plurality of sub-pixels comprises:
   a first sub-pixel including a first side, a second side substantially parallel to the first side, and a third side between an end of the first side and an end of the second side, and a fourth side between another end of the first side and another end of the second side;
   a second sub-pixel adjacent to the first side of the first sub-pixel; and
   a third sub-pixel adjacent to the second sub-pixel, and wherein the second sub-pixel is disposed between the third sub-pixel and the first side of the first sub-pixel.

2. The display device of claim 1, wherein the plurality of sub-pixels comprises a first column of sub-pixels arranged in a first column, and
   wherein the plurality of metal lines comprises:
   a first metal line disposed at a first side of the first column of sub-pixels; and
   a second metal line disposed at a second side of the first column of sub-pixels, wherein the second side of the first column of sub-pixels is opposite to the first side of the first column of sub-pixels.

3. The display device of claim 2, wherein the first column of sub-pixels comprises sub-pixels emitting light of same color.

4. The display device of claim 2, further comprising:
   a first spacer disposed between two neighboring sub-pixels of the plurality of sub-pixels in the display area, and
   wherein a part of the first metal line and a part of the second metal line overlap the first spacer.

5. The display device of claim 2, wherein the first metal line and the second metal line are electrically connected to each other in a region between two adjacent sub-pixels of the first column of sub-pixels.

6. The display device of claim 1, wherein one of the plurality of metal lines extends between the second sub-pixel and the first side of the first sub-pixel.

7. The display device of claim 1, wherein each of the plurality of trace lines comprises a conductive metal line.

8. The display device of claim 7, wherein the conductive metal line extends in the column direction and has a zigzag configuration.

9. The display device of claim 7, further comprising:
   a second spacer between two neighboring sub-pixels of the plurality of sub-pixels in the display area, and
   wherein a part of the first conductive metal line overlaps the second spacer.

10. The display device of claim 1, further comprising a plurality of dummy touch electrodes disposed adjacent to the plurality of island shaped touch electrodes, respectively.

11. A display device comprising:
    a display area in which a plurality of sub-pixels are arranged; and
    a touch sensing layer, the touch sensing layer comprising:
    a plurality of island shaped touch electrodes arranged in a row direction and a column direction in the display area, the plurality of island shaped touch electrodes being spaced apart from each other in the row direction and the column direction in a plan view and comprising a first touch electrode and a second touch electrode spaced apart from each other in a column direction, and
    a plurality of trace lines comprising a first trace line electrically connected to first touch electrode and a second trace line electrically connected to second touch electrode,
    wherein the first trace line and the second trace line each extend in the column direction in the display area,
    wherein the first touch electrode and the second touch electrode each have a zigzag shaped edge,
    wherein the first touch electrode, the second touch electrode, the first trace line, and the second trace line each comprise at least one metal line,
    wherein:
    the at least one metal line of the first touch electrode comprises a first metal line and a second metal line each extending in the column direction and having a zigzag configuration, wherein a first sub-pixel is disposed between a part of the first metal line and a part of the second metal line, and the at least one metal line of the second touch electrode comprises a third metal line and a fourth metal line each extending in the column direction and having a zigzag configuration, and wherein a second sub-pixel is disposed between a part of the third metal line and a part of the fourth metal line.

12. The display device of claim 11, wherein the plurality of sub-pixels comprises a first column of sub-pixels arranged in a first column and comprising the first and second sub-pixels.

13. The display device of claim 12, wherein the first and second sub-pixels emit light of same color.

14. The display device of claim 11, wherein:
the first sub-pixel includes a first side, a second side substantially parallel to the first side, and a third side between an end of the first side and an end of the second side, and a fourth side between another end of the first side and another end of the second side, and wherein the plurality of sub-pixels comprises a third sub-pixel that is disposed adjacent to the first side of the first sub-pixel with the part of the first metal lines therebetween, and the third sub-pixel emits light of a different color from a color of light of the first sub-pixel.

15. The display device of claim 14, wherein the plurality of sub-pixels comprises a fourth sub-pixel disposed adjacent to the third sub-pixel, and the third sub-pixel is disposed between the fourth sub-pixel and the first side of the first sub-pixel, and the fourth sub-pixel emits light of a different color from a color of light of the first sub-pixel and the third sub-pixel, respectively.

16. The display device of claim 11, wherein another part of the first metal line and another part of the second metal line are electrically connected to each other, and another part of the third metal line and another part of the fourth metal line are electrically connected to each other.

17. The display device of claim 11, wherein:
the at least one metal line of each of the first trace line and the second trace line comprises a trace metal line extending in the column direction and having a zigzag configuration, and wherein the trace metal line partially surrounds at least one sub-pixel among the plurality of sub-pixels in a plan view.

18. The display device of claim 11, further comprising:
a first bridge metal line electrically connecting the first touch electrode to the first trace line, and
a second bridge metal line electrically connecting the second touch electrode to the second trace line.

19. The display device of claim 18, wherein:
the second trace line comprises a main portion electrically connected to the second touch electrode via the second bridge metal line and a dummy portion which is separated from the main portion.

20. The display device of claim 19, wherein the first bridge is disposed between an end of the main portion and an end of the dummy portion.

21. The display device of claim 11, further comprising a spacer overlapping the at least one metal line.

22. The display device of claim 11, further comprising a first dummy touch electrode disposed adjacent to the first touch electrode, and a second dummy touch electrode disposed adjacent to the second touch electrode.

23. The display device of claim 22, wherein each of the first dummy touch electrode and the second dummy touch electrode comprises metal lines electrically connected to each other and each having a zigzag configuration.

* * * * *